(12) United States Patent
Fu et al.

(10) Patent No.: US 9,337,153 B2
(45) Date of Patent: May 10, 2016

(54) EMI SHIELDING AND THERMAL DISSIPATION FOR SEMICONDUCTOR DEVICE

(75) Inventors: Peng Fu, Jiangsu (CN); Shan Luo, Shanghai (CN); Zhong Lu, Shanghai (CN); Kaiyou Qian, Shanghai (CN); Chin Tien Chiu, Shanghai (CN); Cheeman Yu, Fremont, CA (US); Hem Takiar, Fremont, CA (US); Ye Bai, Shanghai (CN)

(73) Assignee: SanDisk Information Technology (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 14/008,457

(22) PCT Filed: Dec. 16, 2011

(86) PCT No.: PCT/CN2011/084137
§ 371 (c)(1),
(2), (4) Date: Sep. 27, 2013

(87) PCT Pub. No.: WO2013/086741
PCT Pub. Date: Jun. 20, 2013

(65) Prior Publication Data
US 2014/0015116 A1    Jan. 16, 2014

(51) Int. Cl.
*H01L 23/552* (2006.01)
*H01L 21/56* (2006.01)
(Continued)

(52) U.S. Cl.
CPC .......... *H01L 23/552* (2013.01); *H01L 21/561* (2013.01); *H01L 21/565* (2013.01); *H01L 21/566* (2013.01); *H01L 23/4334* (2013.01); *H01L 24/97* (2013.01); *H01L 24/32* (2013.01);
(Continued)

(58) Field of Classification Search
CPC ..... H01L 23/552; H01L 21/565; H01L 24/97; H01L 21/561; H01L 24/32; H01L 24/48; H01L 24/73
USPC ........................... 257/659, 660, 787; 438/122
See application file for complete search history.

(56) References Cited

U.S. PATENT DOCUMENTS

| | | | |
|---|---|---|---|
| 5,789,064 | A | 8/1998 | Valente et al. |
| 6,707,168 | B1 | 3/2004 | Hoffman et al. |

(Continued)

FOREIGN PATENT DOCUMENTS

| | | |
|---|---|---|
| CN | 101546757 | 9/2009 |
| JP | 2003133352 | 5/2003 |

(Continued)

OTHER PUBLICATIONS

International Search Report and Written Opinion dated Jan. 17, 2013 in International Patent Application No. PCT/CN2011/084137.

(Continued)

*Primary Examiner* — Selim Ahmed
(74) *Attorney, Agent, or Firm* — Vierra Magen Marcus LLP

(57) ABSTRACT

A memory device including a metallic layer shielding electromagnetic radiation and/or dissipating heat, and a method of making the memory device, are disclosed. The metallic layer is formed on a metallic layer transfer assembly. The metallic layer transfer assembly and the unencapsulated memory device are placed in a mold and encapsulated. During the encapsulation and curing of the molding compound, the metallic layer is transferred from the shield to the encapsulated memory device.

21 Claims, 10 Drawing Sheets

(51) Int. Cl.
*H01L 23/433* (2006.01)
*H01L 23/00* (2006.01)
*H01L 25/065* (2006.01)

(52) U.S. Cl.
CPC ............ *H01L 24/48* (2013.01); *H01L 24/73* (2013.01); *H01L 25/0657* (2013.01); *H01L 2223/5442* (2013.01); *H01L 2224/32145* (2013.01); *H01L 2224/32225* (2013.01); *H01L 2224/32245* (2013.01); *H01L 2224/48091* (2013.01); *H01L 2224/48227* (2013.01); *H01L 2224/48247* (2013.01); *H01L 2224/73265* (2013.01); *H01L 2224/97* (2013.01); *H01L 2225/0651* (2013.01); *H01L 2225/06562* (2013.01); *H01L 2924/1434* (2013.01); *H01L 2924/181* (2013.01); *H01L 2924/3025* (2013.01)

(56) References Cited

U.S. PATENT DOCUMENTS

| | | | |
|---|---|---|---|
| 7,264,992 | B2 | 9/2007 | Hsueh et al. |
| 7,288,728 | B2 | 10/2007 | Koike |
| 8,017,255 | B2 | 9/2011 | Kawaguchi |
| 2003/0077420 | A1* | 4/2003 | Brodil ............... B29C 63/0073 428/141 |
| 2005/0206015 | A1 | 9/2005 | Salzman |
| 2007/0223979 | A1* | 9/2007 | Jinzai ............... G03G 15/2057 399/333 |
| 2011/0079933 | A1* | 4/2011 | Sheu ............... B29C 37/0032 264/101 |
| 2011/0298106 | A1 | 12/2011 | Kim |

FOREIGN PATENT DOCUMENTS

| | | |
|---|---|---|
| JP | 2003318210 | 11/2003 |
| TW | 201034160 | 9/2010 |
| TW | 201123396 | 7/2011 |
| TW | 201133656 | 10/2011 |

OTHER PUBLICATIONS

English language Abstract for JP2003318210 published Nov. 7, 2003.
English language Abstract for CN101546757 published Sep. 30, 2009.
English language Abstract for TW201034160 published Sep. 16, 2010.
English language Abstract for TW201123396 published Jul. 1, 2011.
English language Abstract for TW201133656 published Oct. 1, 2011.
Response to Office Action, and English translation of claims as amended therein, filed Jun. 11, 2015 in Taiwan Patent Application No. 101146272.
Office Action dated Jun. 25, 2015 in Korean Patent Application No. 10-2013-7034981.
Response to Office Action filed Aug. 25, 2015 in Korean Patent Application No. 10-2013-7034981.
Office Action dated Dec. 24, 2015 in Korean Patent Application No. 10-2013-7034981.
Office Action dated Dec. 11, 2014 in Taiwan Patent Application No. 101146272.
English language Abstract for JP2003133352 published May 9, 2003.

* cited by examiner

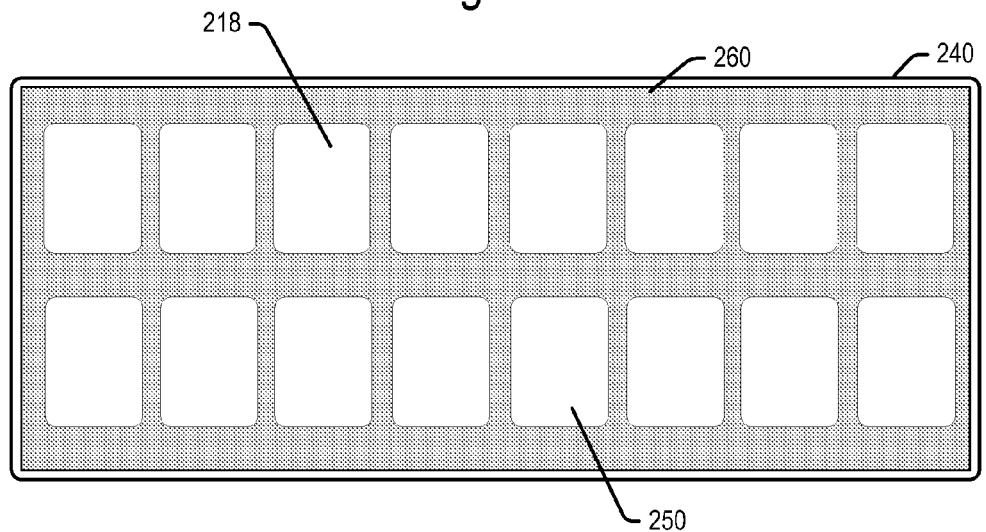
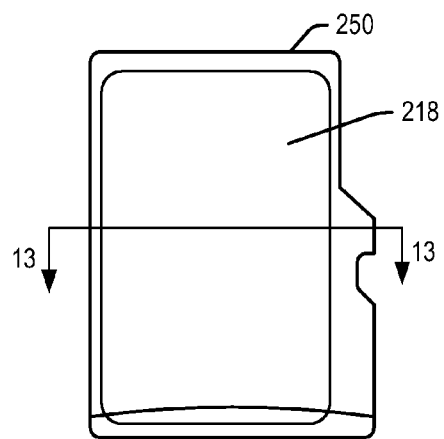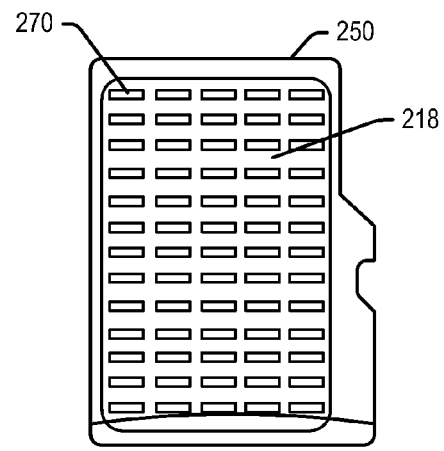

US 9,337,153 B2

EMI SHIELDING AND THERMAL DISSIPATION FOR SEMICONDUCTOR DEVICE

BACKGROUND OF THE INVENTION

1. Field

The present technology relates to fabrication of semiconductor devices.

2. Description of Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While a wide variety of packaging configurations are known, flash memory storage cards may in general be fabricated as system-in-a-package (SiP) or multichip modules (MCM), where a plurality of die are mounted on a substrate in a stacked configuration. An edge view of a conventional semiconductor package 20 (without molding compound) is shown in prior art FIGS. 1 and 2. Typical packages include a plurality of semiconductor die 22, 24 mounted to a substrate 26. It is known to layer semiconductor die on top of each other either with an offset (prior art FIG. 1) or in a stacked configuration. In a stacked configuration, the die 22, 24 may be separated by a spacer layer 34 (prior art FIG. 2), or by a film layer in which the wire bonds from the lower die may embed. Although not shown in FIGS. 1 and 2, the semiconductor die are formed with die bond pads on an upper surface of the die. Substrate 26 may be formed of an electrically insulating core sandwiched between upper and lower conductive layers.

The upper and/or lower conductive layers may be etched to form conductance patterns including electrical leads and bond fingers. Wire bonds may be bonded between the die bond pads of the semiconductor die 22, 24 and the bond fingers of the substrate 26 to electrically couple the semiconductor die to the substrate. The electrical leads on the substrate in turn provide an electrical path between the die and a host device. Once electrical connections between the die and substrate are made, the assembly is then typically encased in a molding compound to provide a protective package.

As electronic components get smaller and operate at higher frequencies, the noise and cross talk caused by electromagnetic interference (EMI) and radiofrequency interference (RFI) are becoming more of a concern. Electromagnetic radiation is emitted by electrical circuits carrying rapidly changing signals as a by-product of their normal operation. EMI is the induction of electromagnetic radiation to other circuits which causes unwanted signals (interference or noise). RFI is transmission of radiofrequency electromagnetic radiation from one circuit to another, also causing unwanted interference or noise.

Some semiconductor packages have attempted to shield the transmission and receipt of EMI and RFI radiation at the semiconductor package level. While preventing interference, these conventional solutions have other disadvantages which make inclusion of such features at the package level undesirable. Thus, shielding is typically performed at the host device level in which a semiconductor package is used. Host device level solutions typically involve providing a metal shield around the space where a semiconductor package is received or mounted.

DESCRIPTION OF THE DRAWINGS

FIG. 10 is a top view of a panel of encapsulated memory devices with a metallic layer being transferred from the metallic layer transfer assembly onto the molding compound.

FIG. 11 is a singulated memory device including a metallic layer according to an embodiment of the present disclosure.

FIG. 12 is a singulated memory device including a metallic layer according to an alternative embodiment of the present disclosure.

DETAILED DESCRIPTION

Embodiments will now be described with reference to FIGS. 3 through 22 which relate to a semiconductor device including EMI/RFI shielding and thermal dissipation. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top," "bottom," "upper," "lower," "vertical" and/or "horizontal" as may be used herein are for convenience and illustrative purposes only, and are not meant to limit the description of the invention inasmuch as the referenced item can be exchanged in position.

Figure 1:
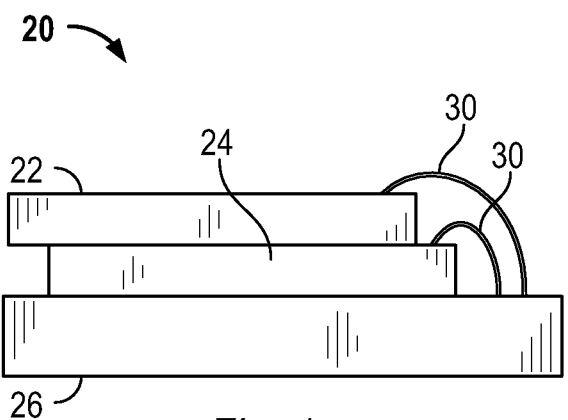
FIGS. 1 and 2 are prior art edge views of two conventional semiconductor package designs with the molding compound omitted.
Figure 2:
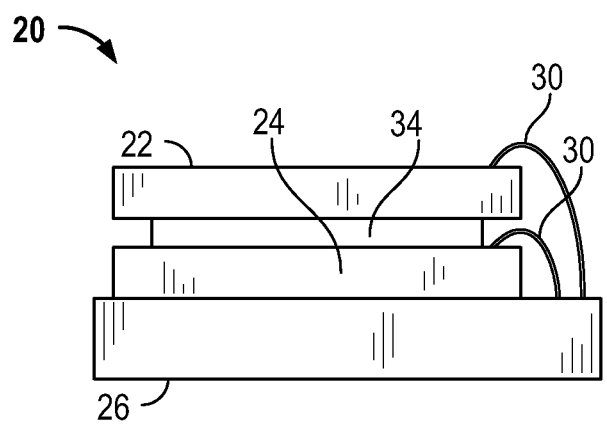
Figure 3:
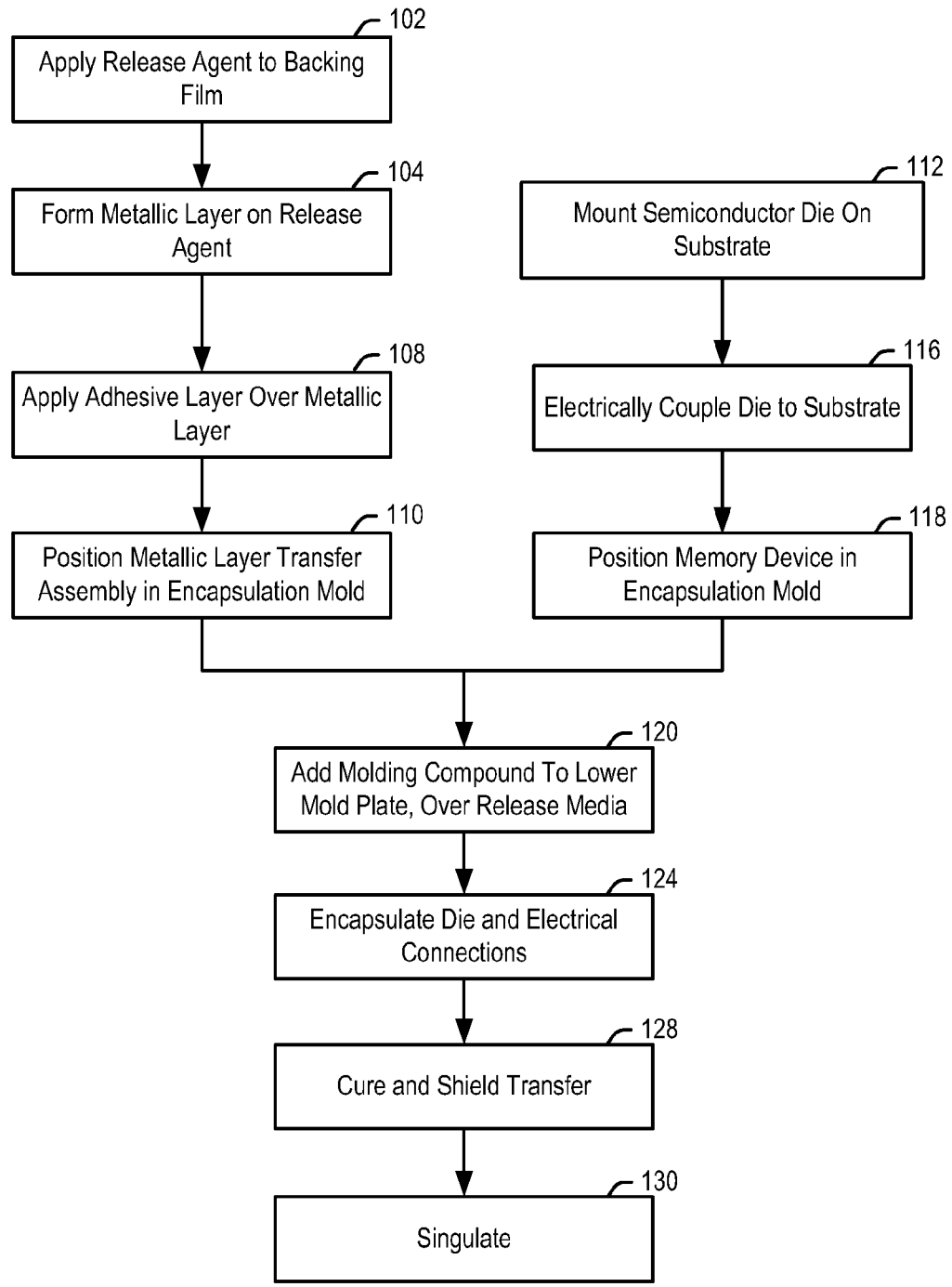
FIG. 3 is a flowchart of an embodiment of the present disclosure.

FIG. 3 is a flowchart of an embodiment for forming a memory device including EMI/RFI shielding and thermal dissipation. Steps 102 through 110 in general relate to the formation of a metallic layer transfer assembly 210. Steps 112 through 130 in general relate to the formation of a semiconductor device using the metallic layer transfer assembly. Each of these steps is explained in greater detail below.

Figure 4:
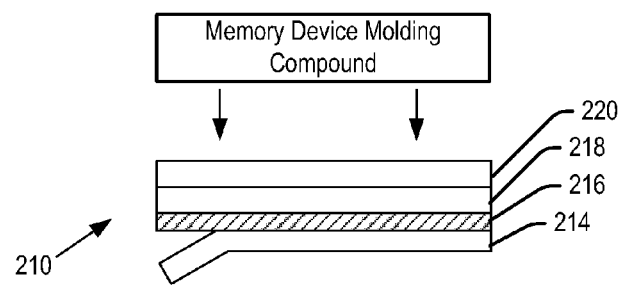
FIG. 4 is an edge view of a portion of a metallic layer transfer assembly that is formed on a memory device during an encapsulation process according to an embodiment of the present disclosure.

Steps 102 through 108 describe one process for forming the metallic layer transfer assembly 210 shown for example in FIG. 4. The metallic layer transfer assembly 210 may be formed of a variety of layers including at least one metallic layer. Examples of metallic layer transfer assembly 210 may include heat transfer foil, such as that from Shanghai HongNi Printing and Packing Material Co., Ltd, having a place of business in Shanghai, China, or IMR (in mold roller) foil, such as that from Nissha Printing Co., Ltd., having a place of business in Kyoto, Japan. The metallic layer transfer assembly may include an ETFE (ethylene tetrafluoroethylene) backing film, such as for example that marketed under the brand name Fluon® from Asahi Glass Co., Ltd., having a place of business in Tokyo, Japan. Other metallic layer transfer assemblies are contemplated.

Metallic layer transfer assembly 210 may have several layers. One example of a metallic layer transfer assembly 210 is shown in more detail in the edge view of FIG. 4. The metallic layer transfer assembly 210 in FIG. 4 may for example be a heat transfer foil or IMR foil. The metallic layer transfer assembly 210 may include a backing film 214, which may for example be a PET (polyethylene terephthalate) film. Other backing films are contemplated.

In step 102, a release agent 216 may be applied onto the backing film 214. The release agent 216 may be a known compound such as for example the release agent ZY-01 from Dongguan Yimeiduo Transfer Material Co., Ltd. in China, and may be applied in various processes, such as for example by a gravure press or coaters. The release agent 216 may be a solid at room temperature with adhesive properties so as to adhere with the backing film 214. However, upon heating the metallic layer transfer assembly 210, the release agent 216 may melt and separate from the backing film 214 as explained below.

In step 104, a metallic layer 218 may be deposited onto the release agent 216. The metallic layer 218 may be various metals, such as for example aluminum or aluminum alloy. Other alternatives include but are not limited to gold, copper and alloys thereof. The metallic layer 218 may be deposited in step 104 for example in a known vacuum vaporization process where the aluminum is vaporized in a vacuum chamber and deposited on the metallic layer transfer assembly 210.

In step 108, an adhesive layer 220 may be applied onto the metallic layer 218. The adhesive layer may for example be adhesive agent XT-088PP from Dongguan Yimeiduo Transfer Material Co., Ltd. in China, and may be applied in various processes, such as for example by a gravure press or coaters. The adhesive layer 220 is capable of cross-linking and adhering to a surface of a molding compound upon being cured as described below.

In an example where the metallic layer transfer assembly 210 is a heat transfer foil, the total thickness of the media may be approximately 30 to 32 micron ($\mu$m). An example using IMR foil may be slightly thicker, at about 50 to 100 $\mu$m. The thicknesses of the metallic layer transfer assembly 210 using these foils may each be thicker or thinner than the above ranges in further embodiments. In these examples, the metallic layer 218 may have a thickness of about 0.05 to 20 $\mu$m, or more specifically 1 to 5 $\mu$m though again, the thickness of the metallic layer may be thicker or thinner than these ranges in further embodiments. Where the metallic layer is an aluminum foil laminated/composited with PET, the thickness may be greater than or equal to 10 $\mu$m.

The metallic layer 218 in embodiments may be a single layer of uniformly deposited material. However, in further embodiments, the metallic layer 218 may be comprised of two or more different materials, either mixed together or separately formed which together make up the metallic layer. For example, some metals and compounds are effective at reflecting electromagnetic waves, while other metals and compounds are effective at absorbing electromagnetic waves. For reflection, the metallic material may have a mobile charge carrier which can interact with the electromagnetic field. For absorption, the metallic material may have electric or/and magnetic dipoles, for example be metal oxides, including but not limited to ferrite, $BaTiO_3$, and $Fe_3O_4$, which interact with the electromagnetic field in the radiation. EMI/RFI shielding by metallic layer 218 as described herein may thus shield by reflection, absorption or a combination of reflection and absorption. Where two or more distinct materials are included in metallic layer 218, the materials may be deposited on top of each other, or the materials in metallic layer 218 may be adhered to each other by a further adhesive layer.

The metallic layer transfer assembly 210 may optionally include additional layers. One such additional layer is a graphic layer, provided between release layer 216 and metallic layer 218, which may include package marking or other graphics. A primer layer may also be used with the graphics layer.

Figure 5:
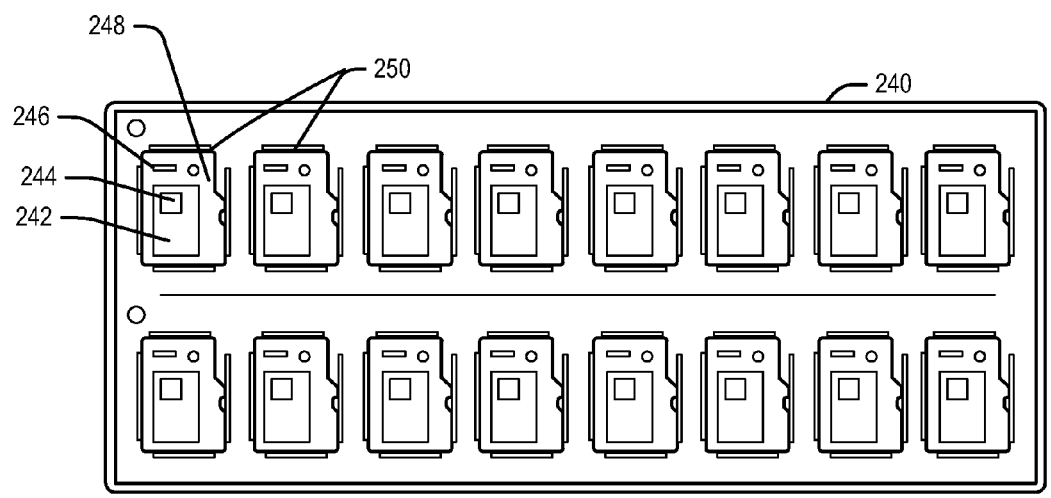
FIG. 5 is a panel of memory devices, prior to encapsulation, according to an embodiment of the present disclosure.

Referring again to the flowchart of FIG. 3, a memory device may be formed in steps 112 and 116. FIG. 5 shows a panel 240 for batch processing a number of memory devices 250 at the same time. FIG. 5 shows the memory devices 250 prior to encapsulation. Each memory device 250 may be formed with various electronic components such as one or more memory die 242, a controller die 244 and passive components 246 (numbered on one memory device 250 in FIG. 5) physically and electrically coupled to a substrate 248.

The panel 240 may for example be a printed circuit board, leadframe or tape automated bonding (TAB) tape. The number of rows and columns of individual memory devices 250 formed on the panel 240 are shown by way of example only, and the number of rows and/or columns may be greater or lesser than shown in further examples of panels 240.

While the example of FIG. 5 includes one or more memory die 242 and a controller die 244, the number and type of semiconductor die are not critical to the present disclosure and may vary in different embodiments. A memory device 250 may include a single semiconductor die, or it may contain for example eight or more memory die 242 together with a controller die 244. In embodiments, the memory device 250 further includes passive components 246, which may for example be resistors, capacitors, inductors and/or other electrical components. The example shown in FIG. 5 has two rows of memory devices 250. It is understood that the number of rows, and the number of memory devices 250 in each row, may vary in further embodiments.

In step 116, the die 242, 244 may be electrically bonded to each other and/or the substrate 248. In one example, step 116 may comprise a known wire bonding process forming wire bonds between the die and substrate. In a further example, step 116 may additionally or alternatively include a known flip chip bonding process to electrically couple one or more die to the substrate.

Figure 6:
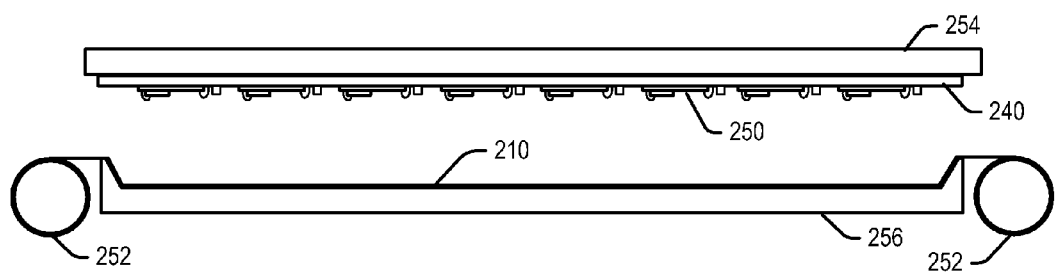
FIG. 6 is an edge view of a panel of memory devices on an upper mold plate and a metallic layer transfer assembly on a lower mold plate prior to encapsulating the memory devices.

The metallic layer transfer assembly 210 may be formed into a long roll, collected between a pair of reels, such as take-up and supply reels 252 shown in FIG. 6. Thus, a single roll of metallic layer transfer assembly 210 may provide shielding for several substrate panels 240. An example of such a roll is used in a Towa FFT-1030 molding machine from Towa Corporation of Kyoto, Japan. However, in further embodiments, the metallic layer transfer assembly 210 may be formed with a shorter length. In one such embodiment, the metallic layer transfer assembly 210 may have a length and width only slightly larger or matching the length and width of panel 240. An example of such a sheet of metallic transfer assembly 210 is used in a Towa PMC-1040 molding machine, also from Towa Corporation of Kyoto, Japan.

In general, the metallic layer 218 of the metallic layer transfer assembly 210 may be applied across the entire surface of the metallic layer transfer assembly 210. In an alternative embodiment, the metallic layer 218 is formed on metallic layer transfer assembly 210 in discrete positions corresponding to the positions of the memory devices 250 on panel 240. Thus, when the metallic layer transfer assembly 210 is applied to the panel 240, the metallic layer 218 is formed only over discrete memory devices 250, and not in the spaces in bottom mold plate 256 between the memory devices 250.

The steps 102, 104 and 108 in forming the metallic layer transfer assembly 210, and the steps 112 and 116 in forming the panel of memory devices, may be performed in parallel with each other, or one process may occur before the other. In any event, once the metallic layer transfer assembly 210 and panel 240 of memory devices 250 have been fabricated, they may be placed within encapsulation mold plates in steps 110 and 118, respectively. One such example is shown in the edge view of FIG. 6. The substrate panel 240 may be mounted to a top mold plate 254 and a bottom mold plate 256 may be lined with the metallic layer transfer assembly 210.

The top mold plate 254 may for example be a vacuum chuck for holding the substrate panel thereon against the forces of gravity. The substrate panel 240 may be held on the top mold plate 254 by other fastening mechanisms in further embodiments. In the example shown, the metallic layer transfer assembly 210 is longer than the mold plates 254, 256 so as to extend beyond the ends of bottom mold plate 256. The shield may be pulled down against the bottom mold plate 256 by a negative pressure applied to the surface of the bottom mold plate. As noted above, the metallic layer transfer assembly 210 may be cut to a size so as to fit within the four edges of the bottom mold plate 256. In the embodiments shown, the length of the metallic layer transfer assembly 210 is oriented left and right from the perspective of the drawings. However, it is understood that the metallic layer transfer assembly may be provided within the bottom mold plate 256 rotated 90° from that shown in the figures (i.e., into and out of the page) without changing the orientation of the panel 240.

Figure 7:
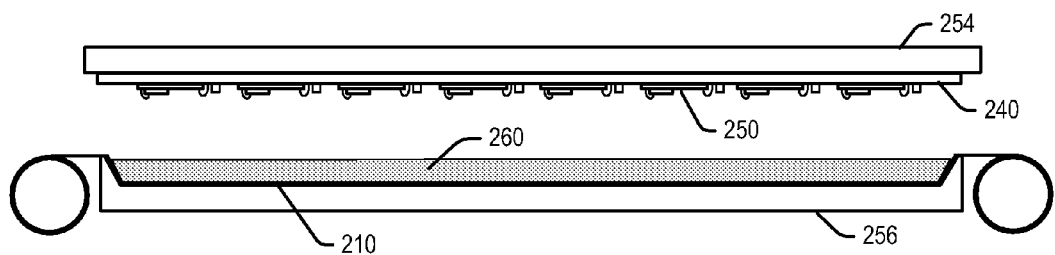
FIG. 7 is an edge view as in FIG. 6, further including molding compound in the lower mold plate.

In step 120 and as shown in FIG. 7, molding compound 260 may be added into the bottom mold plate 256, over the metallic layer transfer assembly 210. In embodiments, the molding compound may be applied as a powder or as granules at room temperature. It may be applied onto the metallic layer transfer assembly 210, and then the metallic layer transfer assembly 210 and molding compound may be moved onto the bottom mold plate 256. In a further example, the metallic layer transfer assembly 210 may be positioned on the bottom mold plate 256 first, and then the molding compound 260 applied. The molding compound 260 may be a commercially available resin, for example sold by Kyocera Chemical Corporation, having a place of business in Saitama, Japan, under model number KE-G1250AH-W3E.

Using molding compound 260, the memory package 250 may be encapsulated in step 124. The encapsulation process may be performed by FFT (Flow Free Thin) compression molding. Such an FFT compression molding process is known and described for example in a publication by Matsutani, H. of Towa Corporation, Kyoto, Japan, entitled "Compression Molding Solutions For Various High End Package And Cost Savings For Standard Package Applications," Microelectronics and Packaging Conference, 2009, which publication is incorporated by reference herein in its entirety. In general, an FFT compression machine makes use of a technique where the panel of substrates is immersed in a mold containing molten molding compound. The molding compound fills all voids on the immersed portions of the panel, and encapsulates each memory device together in the molding compound, without exerting pressure on the die or bond wires. One specific type of FFT compression which may be used is PMC (pure malt compression) molding. Other types of FFT compression techniques and transfer molding techniques may be used in further embodiments.

Figure 8:
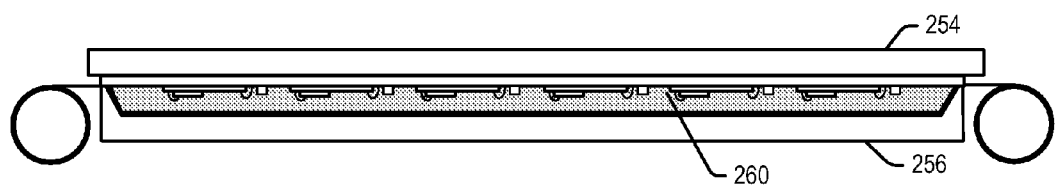
FIG. 8 illustrates the edge view of the mold plates and molding compound of FIG. 7, with the memory devices immersed in the molding compound.

In step 124, the top and bottom mold plates 254, 256 are slowly brought together under vacuum or near vacuum conditions, as shown by the transition from FIG. 7 to FIG. 8. The molding compound 260 may be heated to approximately 175° C. at the time the memory devices 250 are dipped into the molding compound. At that temperature, the molding compound 260 may be in a liquid phase having a viscosity of approximately 16.2 Pa·s. It is understood that both the temperature and viscosity may vary above and below these values in further embodiments.

The mold plates may compress the substrate panel 240 against the bottom mold plate 256 as shown in FIG. 8 at a temperature of 175° C. for a period of about 13 to 15 seconds. Thereafter, a cure and shield transfer step 128 may be performed. As indicated, this step performs two functions. First, step 128 melts the molding compound 260 into a liquid and then cures the molding compound into a solid, protective layer around the electronic components and wire bonds of each memory device 250 on panel 240. Second, step 128 cross links the adhesive layer 220 of the metallic layer transfer assembly 210 to the adjacent surface of the molding compound 260, while melting the release agent 216, to affix and transfer the adhesive layer 220 and metallic layer 218 of metallic layer transfer assembly 210 onto the molding compound 260. The backing film 214 remains on the bottom mold plate 256 by the negative pressure applied to the bottom mold plate.

Figure 9:
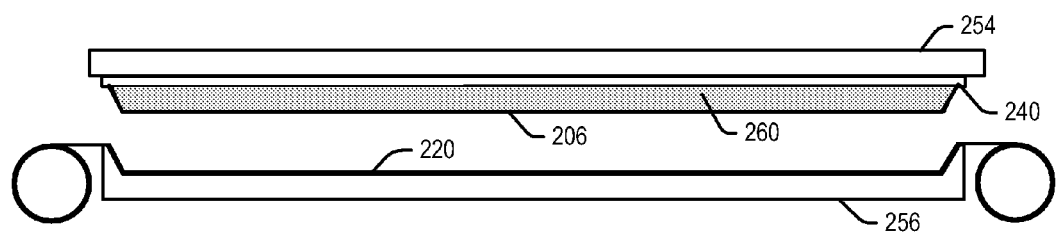
FIG. 9 is an edge view of the upper and lower mold plates and the memory devices in the molding compound after curing of the molding compound.

Thus, when the mold plates 254, 256 are separated from each other as shown in FIG. 9, the metallic layer 218 of the metallic layer transfer assembly 210 remains in or on the surface of the molding compound 260, while the backing film 214 remains with the bottom mold plate 256. A top view of the panel 240 including the transferred metallic layer 218 is shown in FIG. 10 (in an embodiment where the metallic layer 218 is formed in discrete positions corresponding to the positions of the memory devices 250 on panel 240).

The cure and shield transfer step 128 may take approximately 90 seconds, and may be performed at a temperature of 175° C. Where a roll of metallic layer transfer assembly 210 is used, after the above-described steps are performed, the roll may be advanced to position a next length of metallic layer transfer assembly 210 inside the mold plates, and the process repeated. Where precut sections of metallic layer transfer assembly 210 are used, a handler removes the backing film 214, and a new section of pre-cut metallic layer transfer assembly 210 is placed on the bottom mold plate 256.

After application of the molding compound 260, the respective memory devices 250 on the panel 240 may be singulated in step 130, to form finished memory devices 250, shown for example in FIG. 11. FIG. 11 shows an example where memory device 250 is a microSD card. However, it is understood that memory device 250 may be any of various non-volatile memories operative to store information. Examples of memory devices include, but are not limited to, handheld, removable memory cards (such as SD or microSD cards), handheld universal serial bus ("USB") flash drives ("UFD"), embedded memory devices and removable or non-removable hard drives (such as solid-state drives).

In further embodiments, the one or more memory die 242 and/or controller die 244 may themselves be encapsulated in a molding compound prior to being connected to the substrate 248. In such embodiments, the encapsulated memory die and/or controller die may themselves be considered a "memory device" as that term is used herein.

In embodiments, the metallic layer 218 may be a solid, continuous layer of metal. However, in further embodiments, the metallic layer 218 may be formed with openings or in a mesh pattern, one such pattern being shown in FIG. 12. FIG. 12 shows a metallic layer 218 including a plurality of rectangular shaped openings 270 generally defining a mesh pattern in the metallic layer 218. In one example, each opening 270 may be 0.8 mm×0.15 mm, and may be spaced from each other 1 mm along the length dimension and 0.4 mm along the width dimension. The size and spacing of openings 270 may vary from these dimensions in further embodiments. Moreover, the openings 270 need not be rectangular, but can be square, circular, oval, elliptical or other shapes in further embodiments.

In the examples described above, the metallic layer transfer assembly 210 is placed in the bottom mold plate 256 to provide EMI/RFI shielding on a top surface of a finished memory device 250. In further embodiments, metallic layer transfer assembly 210 may be placed in the top mold plate 254 prior to the encapsulation step in addition to or instead of in the bottom mold plate 256 to provide EMI/RFI shielding on the bottom surface of the finished memory device 250 in addition to or instead of on the top surface.

Figure 13:
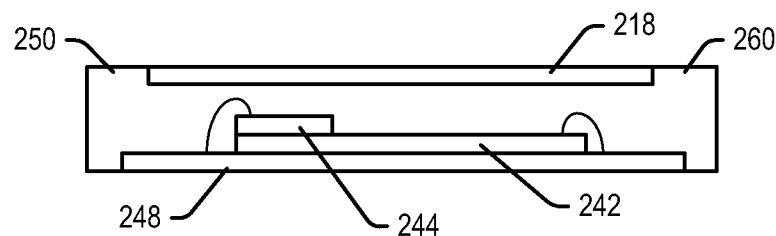
FIG. 13 is a cross-section through line 13-13 of FIG. 11.
Figure 14:
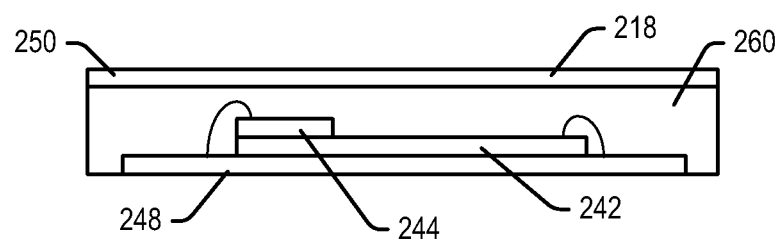
FIGS. 14 and 15 are views similar to FIG. 13, illustrating further embodiments of the present disclosure.
Figure 15:
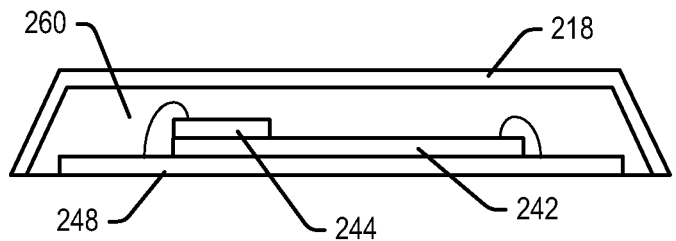
Figure 16:
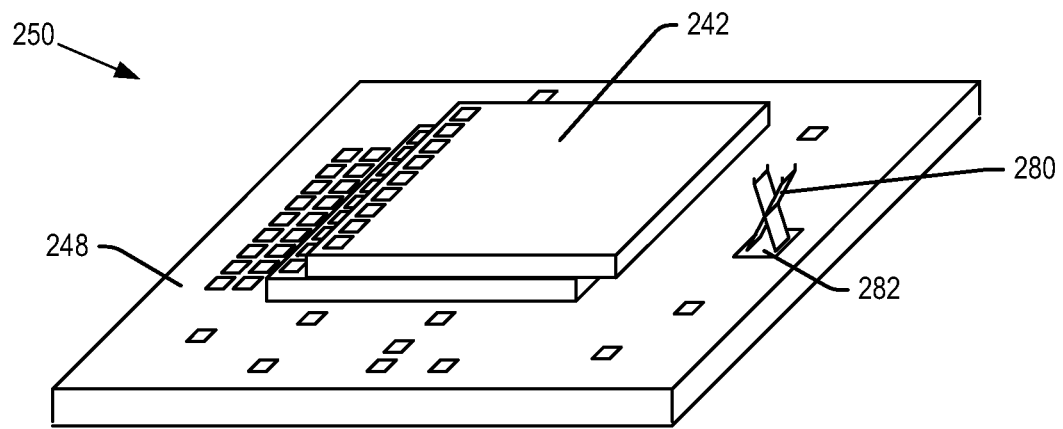
FIG. 16 is a perspective view showing a substrate, memory die and a grounding clip according to embodiments of the present disclosure.

In addition to saving time and process steps, providing an EMI/RFI shield on the memory device 250 during the encapsulation step does not add to the overall thickness of the package. The metallic layer transfer assembly 210 is placed in the mold with the molten molding compound. As a result, the metallic layer transfer assembly 210, and in particular the metallic layer 218, gets embedded in the surface of the molding compound and does not add to the overall thickness of the memory device. That is, the thickness of the memory card formed by the addition of the molding compound would be the same with or without the added metallic layer 218. This aspect is shown in the cross-sectional view of FIG. 13, which is taken through line 13-13 of FIG. 11. While FIG. 13 shows the metallic layer 218 on only a portion of the surface of memory device 250, the metallic layer 218 may cover the entire surface of device 250 as described above. Such an embodiment is shown in FIG. 14.

Moreover, in embodiments, the bottom mold plate 256 may have a wall separating the bottom mold plate into the same number of rows as there are on the substrate panel 240. In such embodiments, the separation wall, as well as the outer boundary walls of the bottom mold plate 256 may be inclined. In such embodiments, the metallic layer transfer assembly 210 may be provided in the bottom of the mold plate 256, as well as on the inclined walls of the mold plate 256. The result is that, when filled with the molding compound and cured as described above, the metallic layer 218 may be provided on the planar top surface of the molding compound 260, as well as on the inclined sides of the molding compound 260. Such an embodiment is shown for example in FIG. 15.

Figure 17:
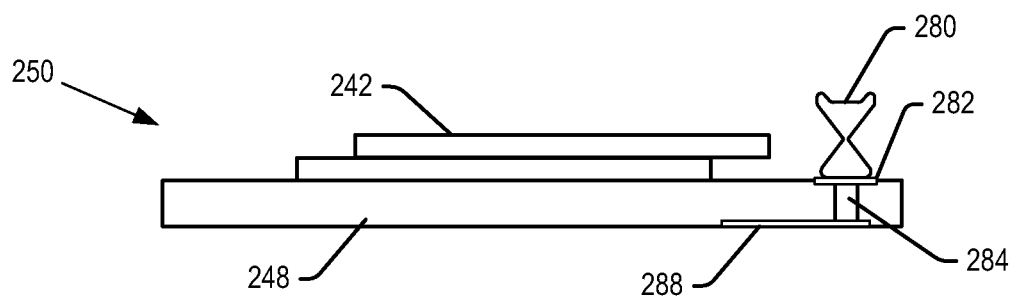
FIG. 17 is an edge view showing a substrate, memory die and a grounding clip of FIG. 16.
Figure 18:
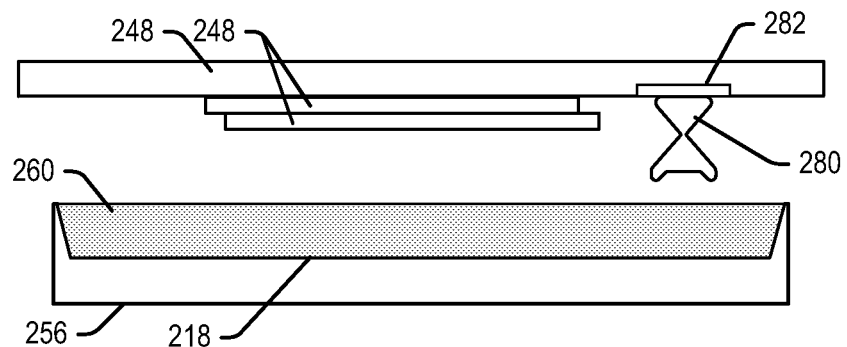
FIG. 18 is an edge view of a memory device with a grounding clip and a lower mold plate including a metallic layer transfer assembly and molding compound.

FIGS. 16-21 show a further embodiment for grounding the metallic layer transfer assembly 210. The example of FIGS. 16-21 includes the substrate 248, a pair of memory die 242 and contact pads on the substrate. The controller die 244 and wire bonds are omitted for clarity. In this embodiment, a grounding clip 280 may be surface mounted to a ground pad 282 formed on the substrate 248 (the grounding clip 280 may be surface mounted prior to mounting of the memory die 242 in further embodiments). As seen in FIG. 17, the ground pad 282 may be coupled by one or more vias 284 to a ground plane 288 within the substrate 248. The ground plane 288 may in turn be soldered or otherwise connected to a ground plane of a printed circuit board or host device to which the memory device 250 is coupled.

The grounding clip 280 may be formed of a flexible material which is electrically conductive, such as for example aluminum, beryllium copper or combinations thereon. Other materials are contemplated. Upper portions of the grounding clip 280 may include tines for engaging within the metallic layer 218 as described below.

Figure 19:
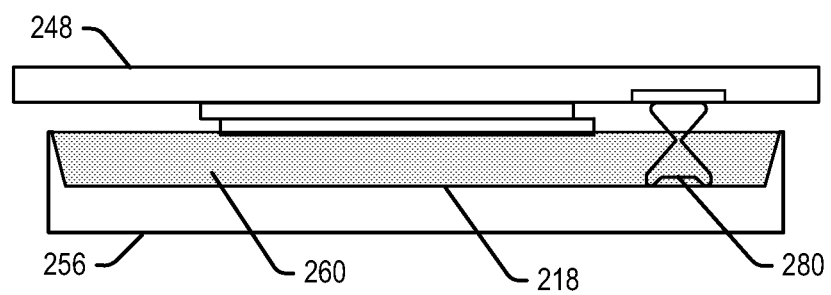
FIG. 19 is an edge view as in FIG. 18, with the grounding clip engaging the metallic layer transfer assembly on the bottom mold plate.
Figure 20:
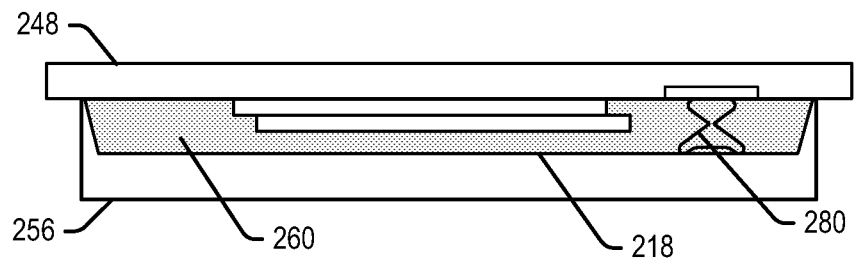
FIG. 20 is an edge view as in FIG. 19, with the grounding clip compressed against the metallic layer transfer assembly on the bottom mold plate.
Figure 21:
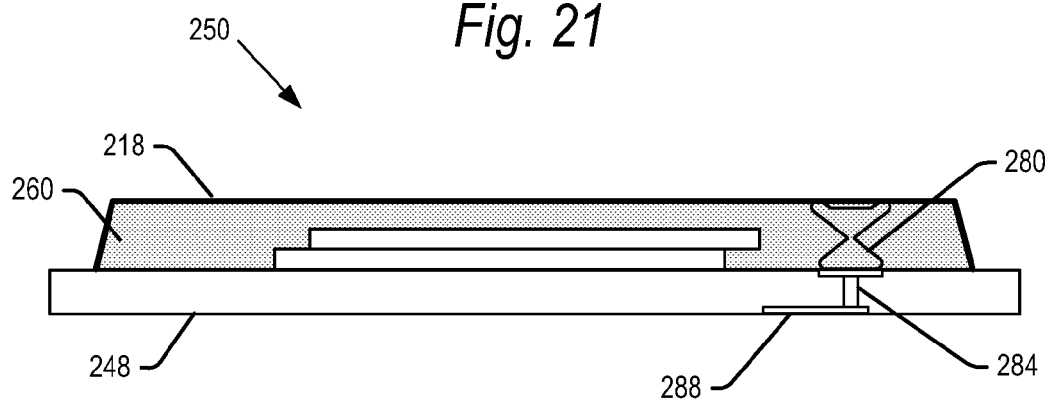
FIG. 21 is a finished memory device according to embodiments of the present disclosure.

During fabrication, a substrate panel 240 including the substrates 248, memory die 242, grounding clip 280 and other components may be inverted and lowered into molding compound 260 as described above and as shown in FIGS. 18 and 19. Before the top and bottom mold plates come together, the grounding clip 280 engages the metallic layer 218 as shown in FIG. 19. Upon further movement of the top and bottom mold plates together, the grounding clip 280 compresses as shown in FIG. 20. The force of the compression firmly engages the grounding clip 280 against and within the metallic layer 218. As noted above, the portion of the grounding clip 280 engaging the metallic layer may include tines to embed within the metallic layer upon compression of the grounding clip 280. When the cured memory device 250 is removed from the molds as shown in FIG. 21, the grounding clip 280 is embedded in the molding compound 260, electrically grounding the metallic layer 218 to a ground plane in the substrate 248.

A particular configuration of the grounding clip 280 is shown in the figures, but in general, the grounding clip 280 may be a compressible spring, or a variety of other configurations, where the grounding clip has solid contact with the metallic layer 218 while surface mounted on the substrate 248 to ground the metallic layer 218. While an embodiment includes a single grounding clip 280, there may be more than one grounding clip 280 in further embodiments. The grounding clip 280 may also be omitted altogether in further embodiments.

Figure 22:
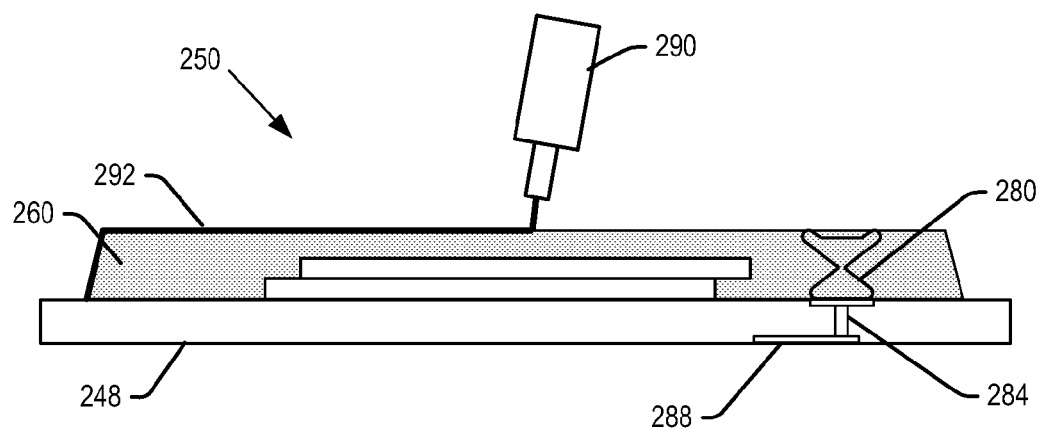
FIG. 22 illustrates an alternative embodiment where a shielding and/or heat dissipation layer is formed on the molding compound after encapsulation.

In the embodiments described above, the EMI/RFI shielding metallic layer 218 is formed on one or more outer surfaces of the molding compound 260 during the encapsulation process. However, in further embodiments, an EMI/RFI shielding layer may be formed on the one or more outer surfaces of the molding compound 260 after the encapsulation process is complete. For example, as shown in FIG. 22, one or more print heads 290 may be provided for printing an electrically and/or thermally conductive layer 292 on one or more surfaces of molding compound 260. The layer may for example be a resin including aluminum, gold or other electrical or thermal conductor. The layer 292 may be applied either before or after singulation of the memory devices 250 from panel 240.

The print head 290 may deposit layer 292 by a variety of technologies, including for example continuous and/or drop on demand (DOD) printing. A variety of other technologies may be used to deposit layer 292 by print head 290 or otherwise, including for example screen printing and thin film deposition. In embodiments, the layer 292 may be a solid, continuous layer. In further embodiments, the layer 292 may be patterned, for example including a mesh pattern as shown in FIG. 12.

The metallic layer 218 of, for example, FIGS. 10-15 and layer 292 of FIG. 22 are effective at shielding electromagnetic and radio frequency radiation, both from leaving the memory device 250 and penetrating into the memory device 250. The layers 218, 292 may additionally or alternatively act as a heat sink for dissipating thermal energy generated by memory devices 250.

In summary, the present technology relates to a memory device including a substrate including a grounding pad; one or more electronic components coupled to the substrate; a molding compound encapsulating the one or more electronic components; a layer formed on one or more surfaces of the molding compound, the layer including metal; and a grounding clip in contact with the grounding pad on the substrate and the layer on the molding compound.

In another example, the present technology relates to a memory device including a substrate including a grounding pad; one or more electronic components coupled to the substrate; a molding compound encapsulating the one or more electronic components; a layer formed on one or more surfaces of the molding compound, the layer including metal; and a grounding clip formed within the molding compound and in contact with the grounding pad on the substrate and the layer on the molding compound.

In a further embodiment, the present technology relates to a method of providing electromagnetic shielding and/or heat dissipation in a memory device, comprising: (a) positioning a metallic layer within a mold for encapsulating the memory device; (b) positioning one or more memory devices within the mold for encapsulating the one or more memory devices; (c) providing an amount of molding compound within the mold for encapsulating the one or more memory devices, the molding compound provided in contact with the metallic layer; (d) encapsulating the one or more memory devices; and (e) adhering the metallic layer to a surface of the molding compound during said step (d) of encapsulating the one or more memory devices.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A memory device, comprising:
a substrate including a grounding pad;
one or more electronic components coupled to the substrate;
a molding compound encapsulating the one or more electronic components;
a layer formed on one or more surfaces of the molding compound, the layer including metal; and
a grounding clip in contact with the grounding pad on the substrate and the layer on the molding compound, the grounding clip comprising a spring construction, the grounding clip being compressed between the substrate and a surface of the molding compound including the layer to ensure contact between the substrate and the layer on the surface of the molding compound.

2. The device of claim 1, wherein the layer on the one or more surfaces of the molding compound is a layer for shielding electromagnetic and/or radio frequency radiation by reflecting and/or absorbing electromagnetic and/or radio frequency radiation.

3. The device of claim 1, wherein the layer on the one or more surfaces of the molding compound is a metal layer for dissipating heat generated within the memory device.

4. The device of claim 1, wherein the layer is from a metallic layer transfer assembly.

5. The device of claim 4, wherein the metallic layer transfer assembly is a heat transfer foil.

6. The device of claim 4, wherein the metallic layer transfer assembly is an in mold roller foil.

7. The device of claim 4, wherein layer is transferred from the metallic layer transfer assembly concurrently with curing of the molding compound.

8. The device of claim 1, wherein the layer includes drops from an inkjet printer.

9. The device of claim 1, wherein the layer is a solid continuous layer.

10. The device of claim 1, wherein the layer has a mesh pattern.

11. A memory device, comprising:
a substrate including a grounding pad;
one or more electronic components coupled to the substrate;
a molding compound encapsulating the one or more electronic components;
a layer formed on one or more surfaces of the molding compound, the layer including metal; and
a grounding clip formed within the molding compound and in contact with the grounding pad on the substrate and the layer on the molding compound, wherein the grounding clip comprises a compressible spring compressed within the molding compound.

12. The device of claim 11, wherein the layer on the one or more surfaces of the molding compound shields electromagnetic and/or radio frequency radiation and dissipates heat from within the memory device.

13. The device of claim 11, wherein the layer is a solid continuous layer.

14. The device of claim 11, wherein the layer has a mesh pattern.

15. A method of providing electromagnetic shielding and/or heat dissipation in a memory device, comprising:

(a) positioning a metallic layer within a mold comprising first and second mold plates for encapsulating the memory device;
(b) positioning one or more memory dies within a top mold plate for encapsulating the one or more memory dies;
(c) providing an amount of molding compound within the bottom mold plate for encapsulating the one or more memory dies, the molding compound provided in contact with the metallic layer;
(d) mounting a grounding clip to the substrate;
(e) encapsulating the one or more memory devices by bringing the first and second mold plates together, the encapsulating step comprising the step of compressing the grounding clip between the substrate and one of the first and second mold plates as the first and second mold plates come together; and
(f) adhering the metallic layer to a surface of the molding compound during said step (e) of encapsulating the one or more memory devices.

16. The method of claim 15, said step (e) comprising encapsulating the one or more memory devices using a compression molding process.

17. The method of claim 15, said steps (e) and (f) comprising applying heat to the molding compound and metallic layer to cure the molding compound and to cross link the metallic layer to the molding compound prior to completion of the curing of the molding compound.

18. The method of claim 15, wherein the memory device comprises a substrate having a grounding pad, the method further comprising the step (g) of grounding the metallic layer to the grounding pad by the grounding clip.

19. The method of claim 15, wherein said step (a) comprises the step of positioning a metallic layer transfer assembly in the bottom mold plate.

20. The method of claim 15, wherein said step (a) comprises the step of positioning a metallic layer having a solid continuous surface in the bottom mold plate.

21. The method of claim 15, wherein said step (a) comprises the step of positioning a metallic layer having a pattern with openings in the metallic layer in the bottom mold plate.

* * * * *